United States Patent
Wang et al.

(10) Patent No.: US 9,523,753 B2
(45) Date of Patent: Dec. 20, 2016

(54) SIMULTANEOUS NON-CONTRAST MR ANGIOGRAPHY AND INTRAPLAQUE HEMORRHAGE (SNAP) MR IMAGING

(75) Inventors: Jinnan Wang, Seattle, WA (US); Michael Günter Helle, Padenstedt (DE); William Sean Kerwin, Seattle, WA (US); Peter Boernert, Hamburg (DE); Chun Yuan, Bellevue, WA (US)

(73) Assignee: Koninklijke Philips N.V., Eindhoven (NL)

( * ) Notice: Subject to any disclaimer, the term of this patent is extended or adjusted under 35 U.S.C. 154(b) by 589 days.

(21) Appl. No.: 14/112,267

(22) PCT Filed: Apr. 13, 2012

(86) PCT No.: PCT/IB2012/051812
§ 371 (c)(1),
(2), (4) Date: Oct. 17, 2013

(87) PCT Pub. No.: WO2012/143831
PCT Pub. Date: Oct. 26, 2012

(65) Prior Publication Data
US 2014/0043021 A1    Feb. 13, 2014

Related U.S. Application Data

(60) Provisional application No. 61/477,840, filed on Apr. 21, 2011.

(51) Int. Cl.
*G01V 3/00* (2006.01)
*G01R 33/563* (2006.01)
*G01R 33/56* (2006.01)

(52) U.S. Cl.
CPC ....... *G01R 33/5635* (2013.01); *G01R 33/5602* (2013.01)

(58) Field of Classification Search
CPC ......................... G01R 33/5635; G01R 33/5602
(Continued)

(56) References Cited

U.S. PATENT DOCUMENTS

2009/0005670 A1    1/2009  Ichinose et al.
2009/0221905 A1*   9/2009  Takei ................. G01R 33/5635
                                                                   600/419
(Continued)

FOREIGN PATENT DOCUMENTS

EP    0984294 A2    3/2000

OTHER PUBLICATIONS

Wang, Jinnan et al "Simultaneous Noncontrast Angiography and Intraplaque Hemorrhage (SNAP) Imaging for Carotid Atherosclerotic Disease Evaluation", Magnetic Resonance in Medicine, Jan. 2012.

(Continued)

*Primary Examiner* — Susan Lee

(57) ABSTRACT

Magnetic resonance (MR) spins are inverted by applying an inversion recovery (IR) radio frequency pulse (50). MR signals are acquired at an inversion time (TI) after the IR radio frequency pulse. TI is selected such that a first tissue of interest (e.g., blood) exhibits negative magnetism excited by the IR radio frequency pulse and a second tissue (e.g., intraplaque hemorrhage tissue) exhibits positive magnetism excited by the IR radio frequency pulse. The acquired magnetic resonance signals are reconstructed to generate spatial pixels or voxels wherein positive pixel or voxel values indicate spatial locations of positive magnetism and negative pixel or voxel values indicates spatial locations of negative magnetism. A first image (28) representative of the first tissue is generated from spatial pixels or voxels having negative signal intensities, and a second image (26) representative of the second tissue is generated from spatial pixels or voxels having positive signal intensities.

15 Claims, 6 Drawing Sheets

(58) Field of Classification Search
USPC .......................................................... 324/306
See application file for complete search history.

(56) References Cited

U.S. PATENT DOCUMENTS

| | | | | |
|---|---|---|---|---|
| 2010/0198053 | A1* | 8/2010 | Miyazaki | G01R 33/5635 600/419 |
| 2011/0071382 | A1* | 3/2011 | Miyazaki | G01R 33/5635 600/413 |
| 2011/0199082 | A1* | 8/2011 | Kimura | G01R 33/56333 324/306 |

OTHER PUBLICATIONS

Wang, Jinnan et al "Improved Human Carotid Intraplaque Hemorrhage Imaging using a Slab-Selective Phase-Sensitive Inversion-Recovery (SPI) Sequence", Proc. Intl. Soc. Magnetic Resonance in Medicine, Jan. 2010.

Wang, Jinnan et al "Improved Carotid Intraplaque Hemorrhage Imaging using a Slab-Selective Phase-Sensitive Inversion Recovery (SPI) Sequence", Magnetic Resonance in Medicine, vol. 64, No. 5, Oct. 2010, pp. 1332-1340.

Xu, D. et al "Hemorrhage Delineation and Blood Suppression Evaluation in Slab-Selection Phase-Sensitive Inversion-recovery (SPI) Sequence with MRI", Proc. Intl. Soc. Magnetic Resonance in Medicine, Jan. 2010.

Ji, Xiuquan et al "TI-Based Brain Image Segmentation using Phase-Sensitive Inversion recovery Imaging", Proc. Intl. Soc. Magnetic Resonance in Medicine, Jan. 2000.

Xie, J. et al "3D Flow-Insensitive Coronary Vessel Wall Imaging using Phase Senstivie Inversion Recovery", Proc. Intl. Soc. Magnetic Resonance in Medicine, Jan. 2010.

Calamante, Fernando et al "Measuring Cerbral Blood Flow using Magnetic Resonance Imaging Techniques", Journal of Cerebral Blood Flow and Metabolism, vol. 19, 1999, pp. 701-735.

Wu, Wen-Chau et al "A Theoretical and Experimental Investigation of the Tagging Efficiency of Pseudocontinuous Arterial Spin Labeling", Magnetic Resonance in Medicine, vol. 58, 2007, pp. 1020-1027.

* cited by examiner

SIMULTANEOUS NON-CONTRAST MR ANGIOGRAPHY AND INTRAPLAQUE HEMORRHAGE (SNAP) MR IMAGING

CROSS-REFERENCE TO PRIOR APPLICATIONS

This application is the U.S. National Phase application under 35 U.S.C. §371 of International Application No. PCT/IB2012/051812, filed on Apr. 13, 2012, which claims the benefit of U.S. Provisional Patent Application No. 61/477,840, filed on Apr. 21, 2011. These applications are hereby incorporated by reference herein.

This application claims the benefit of U.S. Provisional Application No. 60/477,840 filed Apr. 21, 2011 and titled "Simultaneous Non-contrast Angiography and IntraPlaque hemorrhage (SNAP) imaging".

The following relates to the magnetic resonance arts, magnetic resonance imaging (MRI) arts, magnetic resonance angiography (MRA) arts, and to applications thereof such as medical imaging, veterinary imaging, and so forth.

The detection of intraplaque hemorrhage (IPH) using MRI is of clinical value as IPH has been found to be associated with significantly increased clinical symptoms (stroke and/or heart attack) and accelerated disease progression. Assessment of IPH has also been found to be helpful for treatment planning, in that subjects with carotid IPH have been found to be more likely to develop stroke if stenting is used for treatment, as compared with traditional endarterectomy surgery. These clinical findings underscore the importance of developing a time-efficient IPH detection and quantification technique for clinical application.

However, the detection of IPH using existing magnetic resonance imaging (MRI) based techniques usually requires an extra magnetic resonance (MR) sequence that is specially designed for IPH imaging, beyond the regularly applied MR angiography technique. Additionally, the IPH imaging technique generally has limited sensitivity to other aspects of the anatomy, such as the vessel lumen, which makes localization (i.e., registration) of the IPH data relative to the MRA data difficult.

The following contemplates improved apparatuses and methods that overcome the aforementioned limitations and others.

According to one aspect, a method comprises: inverting magnetic resonance spins by applying an inversion recovery (IR) radio frequency pulse to a subject disposed in a static ($B_0$) magnetic field; acquiring magnetic resonance signals from the subject at an inversion time (TI) after the IR radio frequency pulse wherein the inversion time (TI) is selected such that a first tissue of interest of the subject exhibits negative magnetism excited by the IR radio frequency pulse and a second tissue of interest of the subject exhibits positive magnetism excited by the IR radio frequency pulse; reconstructing the acquired magnetic resonance signals to generate spatial pixels or voxels wherein a positive value for a spatial pixel or voxel indicates a spatial location of positive magnetism and a negative value for a pixel or voxel indicates a spatial location of negative magnetism; generating a first image representative of the first tissue of interest comprising the generated spatial pixels or voxels having negative signal intensities; and generating a second image representative of the second tissue of interest comprising the generated spatial pixels or voxels having positive signal intensities. In some embodiments the first tissue of interest comprises blood and the second tissue of interest comprises intraplaque hemorrhage (IPH) tissue.

According to another aspect, an apparatus comprises a magnetic resonance scanner and an electronic data processing device. The magnetic resonance scanner is configured to perform operations including inverting magnetic resonance spins by applying an inversion recovery (IR) radio frequency pulse to a subject disposed in a static ($B_0$) magnetic field, and acquiring magnetic resonance signals from the subject at an inversion time (TI) after the IR radio frequency pulse. The inversion time (TI) is selected such that acquired blood signal exhibits negative magnetism and acquired intraplaque hemorrhage (IPH) tissue signal exhibits positive magnetism. The electronic data processing device is configured to perform operations including reconstructing the acquired magnetic resonance signals to generate an image comprising spatial pixels or voxels, and thresholding the spatial pixels or voxels to form a magnetic resonance angiography (MRA) image representative of blood and an IPH image representative of IPH tissue. Optionally, the magnetic resonance scanner performs a blood flow labeling sequence after the inverting and before the acquiring.

According to another aspect, a method is disclosed which operates on a magnetic resonance image acquired using magnetic resonance manipulation imparting a relatively lower value to spatial pixels or voxels of the magnetic resonance image representing blood and a relatively higher value to pixels or voxels representing intraplaque hemorrhage (IPH) tissue. The method comprises: thresholding the spatial pixels or voxels to form a magnetic resonance angiography (MRA) image representative of blood and an IPH image representative of IPH tissue; and displaying at least one of (1) the MRA image; the IPH image; and a fused image combining the MRA image and the IPH image. The thresholding is suitably performed by an electronic data processing device.

One advantage resides in providing simultaneous detection and quantification of both luminal stenosis (via MRA) and IPH in one MR scan.

Another advantage resides in reduced scanning time and improved review process through elimination of an extra IPH scan, as well as automatic matching and registration at the time of review.

Another advantage resides in providing both MRA and IPH data without administration of a magnetic contrast agent.

Another advantage resides in providing high IPH contrast.

Another advantage resides in providing effective luminal delineation.

Numerous additional advantages and benefits will become apparent to those of ordinary skill in the art upon reading the following detailed description.

The invention may take form in various components and arrangements of components, and in various process operations and arrangements of process operations. The drawings are only for the purpose of illustrating preferred embodiments and are not to be construed as limiting the invention.

FIG. 1 diagrammatically shows a magnetic resonance angiography system for performing Simultaneous Non-contrast Angiography and intraPlaque hemorrhage (SNAP) imaging.

FIG. 2 diagrammatically shows a SNAP pulse sequence.

FIG. 3 diagrammatically plots theoretical tissue signal levels for IPH, vessel wall, and blood (i.e., lumen) as a function of inversion time.

Figure 6:
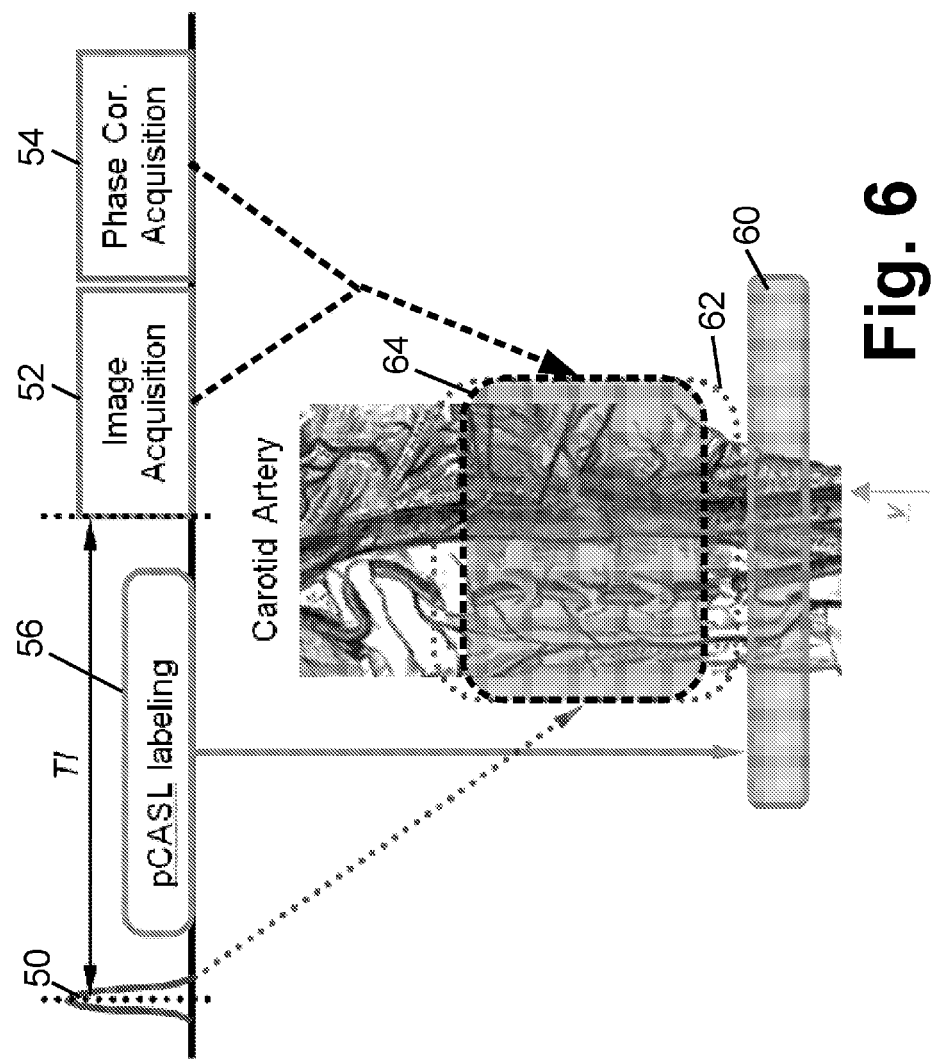

FIG. 6 diagrammatically shows modification of the SNAP pulse sequence to incorporate flow labeling.

It is recognized herein that a technique that can simultaneously provide both magnetic resonance angiography (MRA) data and intraplaque hemorrhage (IPH) data in one MR scan would be advantageous. With such a technique, not only could the extra scan time for IPH imaging be reduced, but spatial registration of the IPH image with the MRA image would be automatically achieved, thus eliminating the necessity of matching the two images at the time of diagnosis.

Disclosed herein is a technique that simultaneously provides both MRA data and IPH data in one MR scan. The disclosed technique is referred to herein as the Simultaneous Non-contrast Angiography and intraPlaque hemorrhage (SNAP) technique. SNAP provides the following advantages: (1) Simultaneous detection and quantification of both luminal stenosis (via MRA) and IPH; (2) reduced scanning time and improved review process through elimination of an extra IPH scan, as well as automatic matching and registration at the time of review; (3) providing both MRA and IPH data without administration of a magnetic contrast agent; (4) providing high IPH contrast as compared with existing dedicated IPH imaging techniques; and (5) providing effective luminal delineation as compared with existing time of flight (TOF) magnetic resonance angiography (MRA) techniques. Automated segmentation of both lumen and intraplaque hemorrhage can also be achieved using simple signal intensity thresholding, due to the inherent high contrast among tissues.

Figure 1:
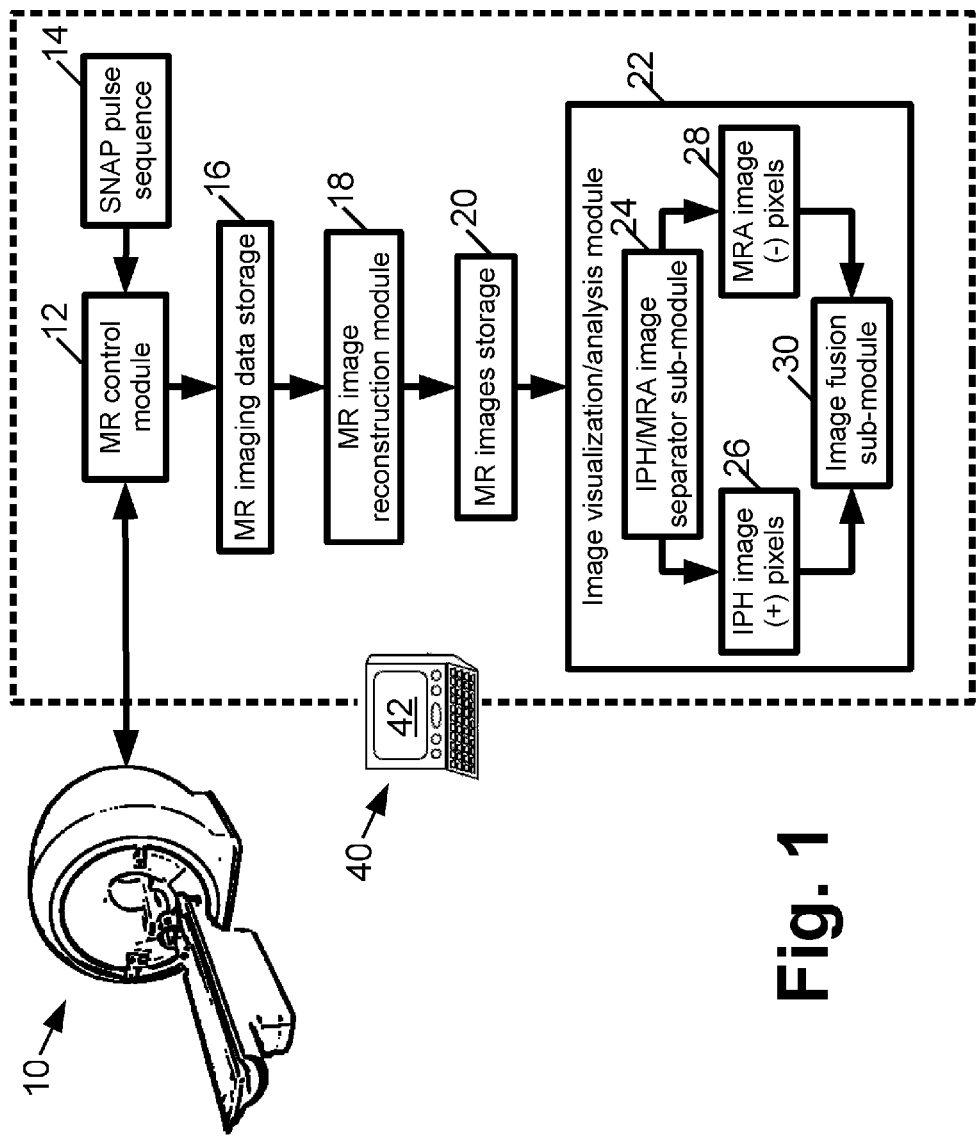

With reference to FIG. 1, an illustrative magnetic resonance imaging (MRI) system includes an MR scanner 10 operated by a magnetic resonance (MR) control module 12 to retrieve a SNAP pulse sequence from a sequences storage 14 and to execute the retrieved SNAP sequence to perform simultaneous IPH/MRA imaging of a subject (for example, a human subject, a veterinary subject, a clinical or preclinical test subject, or so forth) disposed in a static ($B_0$) magnetic field. The MRI scanner 10 can be any type of commercial or non-commercial MRI scanner, such as (by way of illustrative example) an Achieva™, Ingenia™, Intera™, or Panorama™ MRI scanner (available from Koninklijke Philips Electronics N.V., Eindhoven, The Netherlands). The performed SNAP sequence generates MR imaging data that are suitably stored in an MR imaging data storage 16. An MR image reconstruction module 18 applies a suitable image reconstruction algorithm to the MR imaging data to generate a (composite) image which is suitably stored in an MR images storage 20. The choice of image reconstruction algorithm depends upon the spatial encoding employed in the imaging data acquisition and may, for example, be a Fourier transform-based image reconstruction algorithm.

As disclosed herein, the SNAP sequence is designed such that pixels corresponding to IPH and pixels corresponding to blood (i.e., MRA) can be separated simple signal intensity thresholding. Accordingly, an image visualization/analysis module 22 suitably includes an IPH/MRA separator sub-module 24 that separates positive pixels into an IPH image 26 and negative pixels into an MRA image 28. The IPH and MRA images 24, 26 may be variously analyzed, measured, and/or visualized. For example, in some embodiments an image fusion sub-processor 30 generates a fused image or view (e.g., a maximum intensity projection or MIP) that combines the IPH and MRA images 24, 26 in a color-coded or otherwise delineated view.

The data processing and control components 12, 18, 22, 24, 30 are suitably implemented by an electronic data processing device 40, such as a suitably programmed illustrative computer 40, a network based server, or so forth, that includes or has operative access to a display device 42 via which the visualization module 22 displays images or views (e.g., MIP views). In some embodiments analog or mixed circuitry may also be included, e.g. parallel reconstruction pipeline hardware optionally used in the image reconstruction module 18. The MR control module 12 is optionally implemented as a separate dedicated MR control computer. The image visualization module 22 may be implemented as a dedicated image processing workstation with a high resolution display.

The disclosed combined IPH/MRA imaging techniques employing the SNAP sequence can also be embodied as a non-transitory storage medium (not shown) such as a hard disk or other magnetic storage medium, optical disk or other optical storage medium, random access memory (RAM), flash memory or other electronic storage medium, or so forth, which stores instructions that are executable by the electronic data processing device 30 to perform the disclosed imaging techniques.

Figure 2:
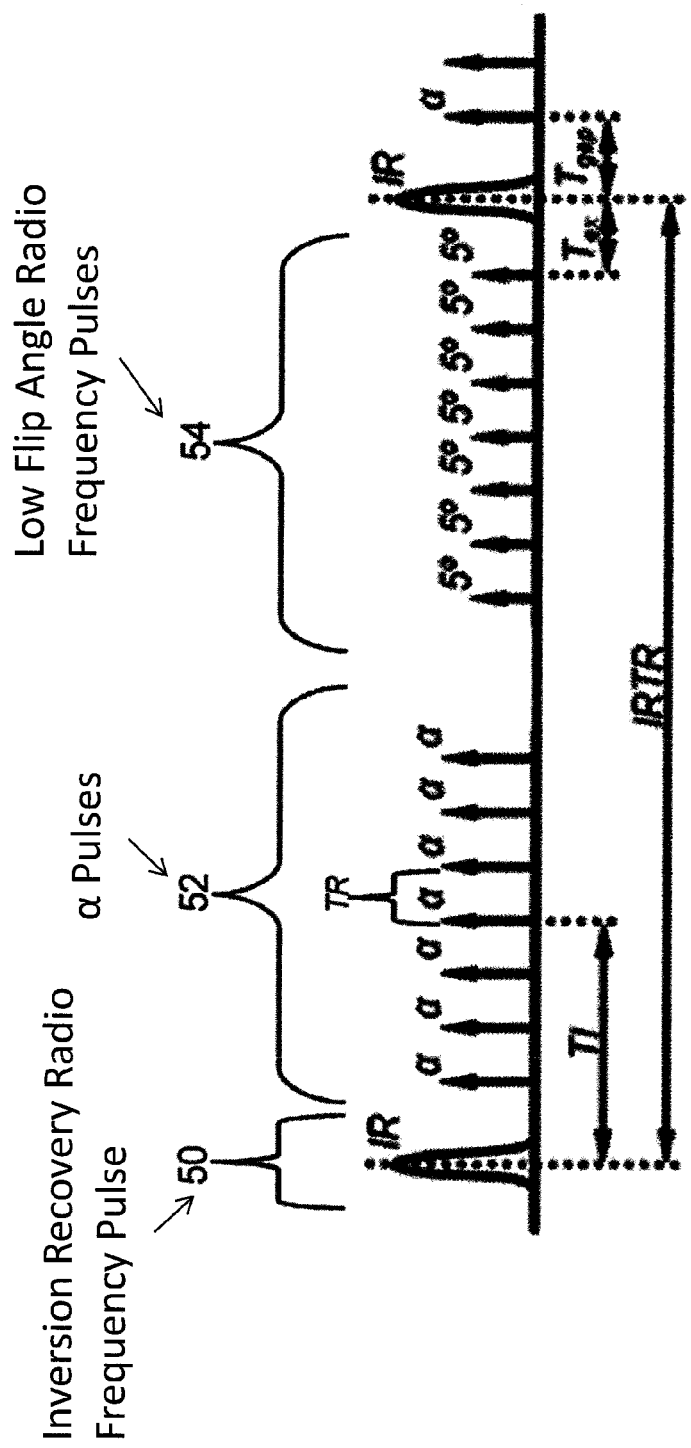

With reference to FIG. 2, an illustrative Simultaneous Non-contrast Angiography and IntraPlaque hemorrhage (SNAP) pulse sequence is diagrammatically shown. This sequence includes an inversion recovery (IR) radio frequency (RF) pulse 50 that is preferably slab-selective for optimized blood inversion. The α pulses 52 of the SNAP sequence of FIG. 2 represent RF pulses in a gradient echo sequence, used for data acquisition. The following low flip angle RF pulses 54 (a flip angle of 5° is used in the illustrative example of FIG. 2) are used for phase-sensitive reconstruction to retrieve the negative magnetization of blood in the lumen (still inverted). The time TI is the inversion time for maximized IPH (already T1-relaxed to result in positive Mz), vessel wall and lumen contrast. The time interval IRTR is the time interval between two successive IR pulses.

The time interval between α pulses 52 is denoted TR, and should be short to improve the acquisition efficiency. The flip angle (α) and the inversion time TI are suitably jointly optimized to achieve high IPH and lumen contrasts, with the optimized values for α and TI depending on the specific application and hardware setup. For example, in a typical carotid artery imaging setup, TI is chosen as 500 ms and the flip angle (FA or α) is chosen as 11°, using a Bloch equation derived computer simulation program.

Figure 3:
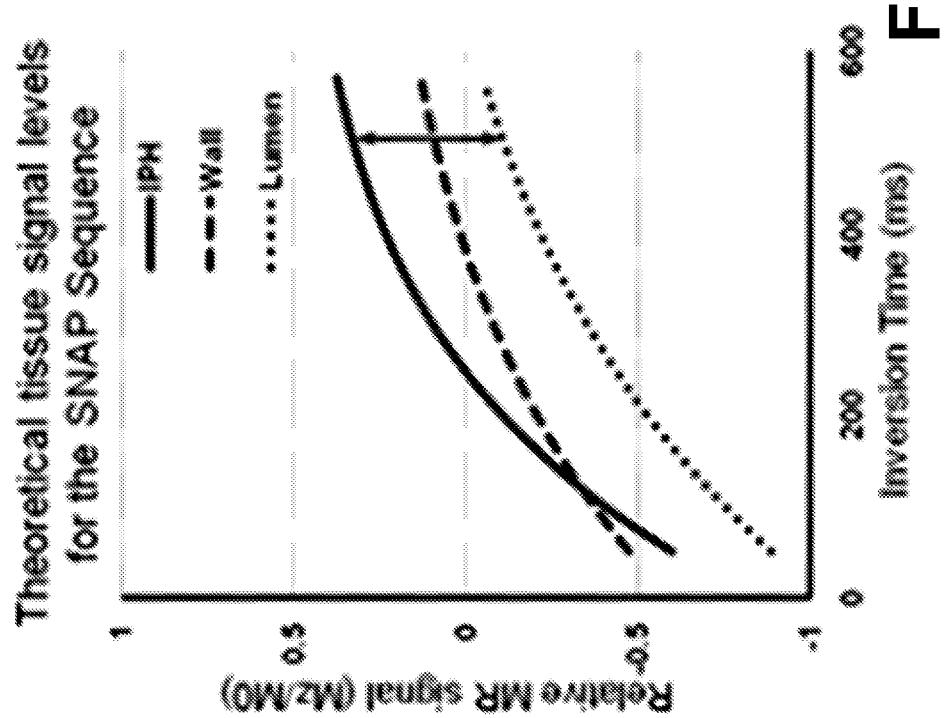

With reference to FIG. 3, the evolution of the theoretical signal (SI) as a result of the illustrative SNAP pulse sequence of FIG. 2 is shown. From top to bottom the three curves in FIG. 3 are IPH (solid line), vessel wall (dashed line), and blood lumen (dotted line). The vertical double headed arrow in FIG. 3 indicates the location of the optimized inversion time (TI=500 ms). As shown, at this optimized TI the IPH and lumen tissues have strong positive (SI>0) and negative (SI<0) signals (SI denotes "signal intensity"), respectively, compared to the background (SI=0). Thus, at the optimal TI, IPH exhibits a relatively strong positive signal, whereas the lumen (blood) exhibits a relatively strong negative signal (i.e. below zero). Other tissues, such as the vessel wall, exhibit signals near zero.

Once optimized, the SNAP sequence (e.g., FIG. 2) can be applied as any regular MR pulse sequence, but ensuring that the inversion pulse is applied along with the main direction of the blood flow. The 5° flip angle for phase sensitive reconstruction shown in FIG. 2 is illustrative only. The actual value may vary depending on the particular imaging application.

With reference back to FIG. 1, after acquisition the two image components (MRA and IPH) are readily separated by the IPH/MRA separator sub-module 24 and displayed on the basis of the sign of each imaged pixel. Pixels with negative intensity values are assigned to the MRA image 28, while pixels with positive intensity values are assigned to the IPH image 26. (In the case of the MRA image component, the absolute value of the pixels is optionally taken after MRA/IPH separation in order to avoid dealing with negative pixel values.)

Figure 4:
FIG. 4 shows positive (IPH, left) and negative (MRA, right) images acquired by a SNAP pulse sequence.
Figure 4:
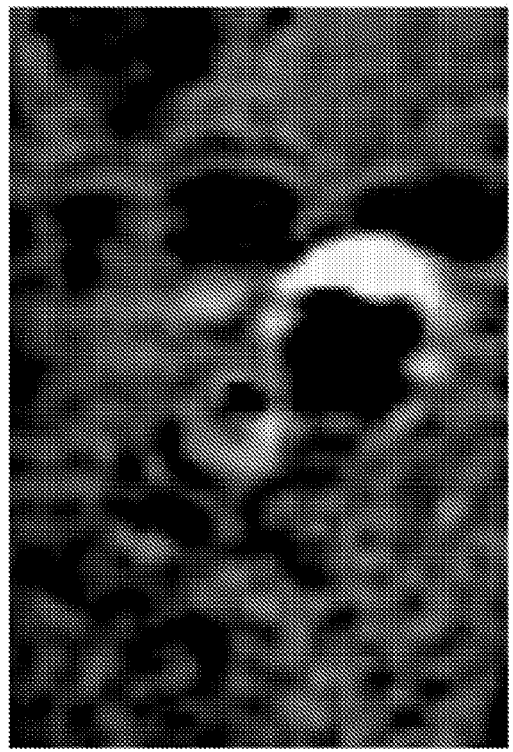

With reference to FIG. 4, an illustrative example is shown of positive (left) and negative (right) images produced by SNAP in one acquisition. In the positive image, high signal regions consist of IPH and in the negative image, high signal regions correspond to flowing blood (i.e., MRA).

Because the SNAP sequence acquires data in three dimensions, three-dimensional (3D) visualization tools, such as maximum intensity projection (MIP) views, can be used to visualize the data. For example, separate MIP images can be produced from the negative (MRA) and positive (IPH) images, or color-coded overlays can be generated to display the location of IPH relative to angiographic landmarks of the MRA image.

Figure 5:
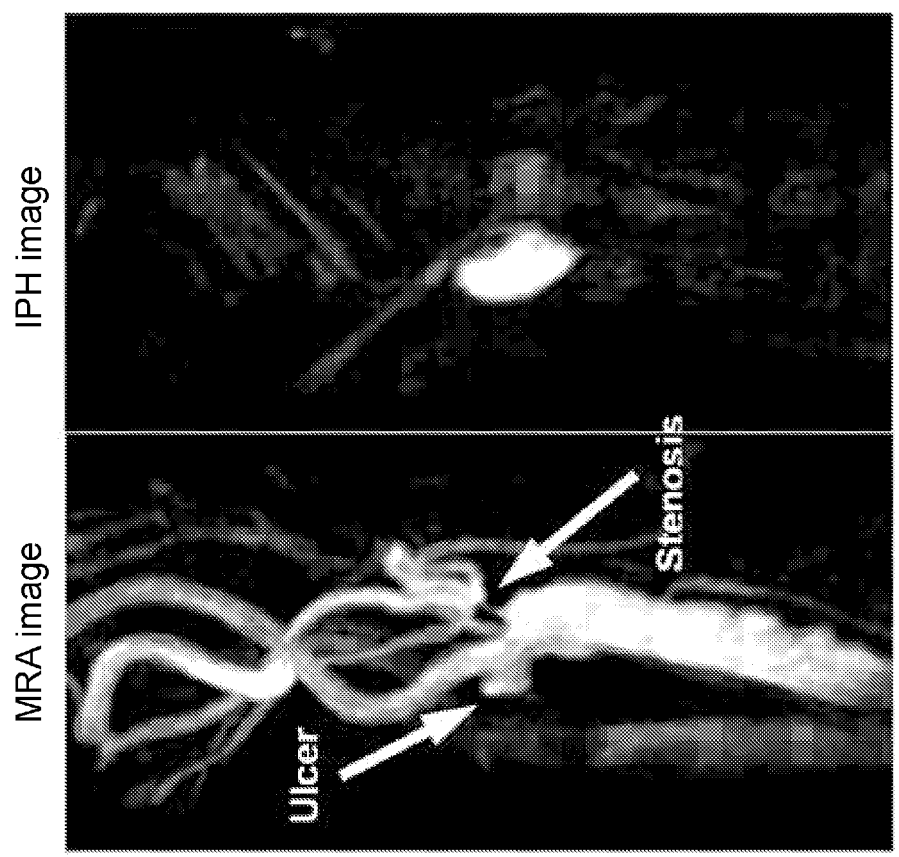
FIG. 5 shows MRA (left) and IPH (right) maximum intensity projection (MIP) views acquired by a SNAP pulse sequence.

With reference to FIG. 5, MIP views of 3D data sets acquired using SNAP are shown. FIG. 5 shows the MRA data (left image) and the IPH data (right image). Both images were acquired in one session. Optionally, the image fusion sub-module 30 (see FIG. 1) generates a color-coded SNAP image showing the MRA in one color (e.g., cyan) and the IPH in a different color (e.g., red). The quality of the MRA image (left image of FIG. 5) is high, with the sharp delineation of ulcer, stenosis and small vessel branches.

The SNAP technique is suitably employed to simultaneously detect stenosis and/or IPH in any major artery (coronary, carotid, peripheral, et cetera). The MRA component is suitably used to assist in localization of the IPH relative to the vascular anatomy. In this regard, note that the MRA and IPH images are inherently spatially registered with each other, since they are generated from the same (composite) image. The MRA component may also be used for any other purpose to which MRA imaging is suitably applied. The disclosed SNAP technique can also be employed as a non-contrast MRA technique if the negative image is displayed (that is, if the IPH image component is discarded).

The disclosed SNAP technique is readily extended for other purposes in which dual imaging is beneficial. One such purpose is to visualize the uptake of targeted contrast agents for molecular imaging. Tissues with strong uptake would behave similar to IPH and show up as bright regions in the positive images, which could then be localized relative to the MRA.

To generate the negative-contrast MRA image 28, in-flow blood needs to be completely inverted before it is imaged. In the SNAP pulse sequence (e.g., FIG. 2), effective inversion is achieved by suitable placement of the inversion slab with proper thickness based on the known blood velocity in the region. However, an issue can arise when the subject being imaged exhibits an unconventional blood velocity at the imaging region, either too low or too high. Flow artifacts may occur in the resulting MRA image. When the blood velocity is too high, the blood is not properly inverted when it is imaged. On the other hand, if the blood velocity is too low, then the blood is inverted twice (i.e. back to positive) at the time of imaging. It is desired to invert all blood only once at the time of imaging, regardless of the flow velocity.

Another possible issue is venous contamination in the SNAP imaging. Due to the non-directional inversion of the blood flow, both arterial and venous flow can be visualized in SNAP. As a consequence flow related artifacts may be present in the MRA image 28 (see FIG. 1) generated by the SNAP pulse sequence.

A modified SNAP sequence, referred to herein as a robust flow-labeling SNAP (rSNAP) sequence, suppresses artifacts due to unconventional blood velocity and/or venous contamination of the SNAP imaging. The rSNAP sequence incorporates labeling into the SNAP sequence. Various labeling approaches, such as magnetization transfer insensitive labeling technique (TILT), flow-sensitive alternating inversion recovery (FAIR), continuous arterial spin labeling (CASL), pulsed continuous arterial spin labeling (pCASL), and so forth, are known for achieving uniform blood inversion in arterial spin labeling (ASL)-based perfusion imaging. See, e.g. Calamante et al., "Measuring Cerebral Blood Flow Using Magnetic Resonance Imaging Techniques", Journal of Cerebral Blood Flow and Metabolism vol. 19 pages 701-735 (1999); Wu et al., "A Theoretical and Experimental Investigation of the Tagging Efficiency of Pseudo-continuous Arterial Spin Labeling", Magnetic Resonance in Medicine vol. 58 pages 1020-1027 (2007). Depending on the specific application, when a proper labeling technique is combined with SNAP, robust blood labeling can be achieved. Moreover, if appropriate labeling is applied on the correct side of the imaging plane/volume (e.g. proximal or distal, that is, applied on the side from which arterial blood inflows), then venous contamination can also be avoided.

With reference to FIG. 6, a suitable Robust flow labeling SNAP (rSNAP) pulse sequence is shown on top, with the (spatial) application region of different segments indicated in the lower diagram. In this example, a pCASL-type of labeling RF pulse train 56 is used as an illustrative labeling scheme. TI is the inversion time between the IR pulse 50 and the acquisition 52. The pCASL-RF pulse train 56 is only applied proximally in this case, that is, in a proximal region 60, and so no venous blood will be seen in the final MRA image. In the rSNAP sequence, the dedicated flow labeling segment 56 is placed between the inversion pulse 50 and the image acquisition segment 52 of the SNAP sequence of FIG. 2. In the rSNAP sequence of FIG. 6, the initial inversion pulse 50 is slab selective to an area 62 that is larger than the desired field of view (FOV) 64 that is imaged by the image acquisition segment 52. By placing the additional and appropriate labeling segment 60 more downstream this way, neither the inversion pulse 50 nor the imaging acquisition parts 52, 54 will be impacted by the labeling event, but freshly incoming blood will be appropriately manipulated.

In FIG. 6, a pCASL-type RF pulse train (pulsed continuous arterial spin labelling) is used as an example labeling approach for the dedicated flow labeling segment 56 of the rSNAP imaging pulse sequence. The pCASL labelling time should be as long as possible while also being planned to accommodate other purposes. For example, an some embodiments the optimal nversion time (TI) for the IPH imaging is between 400-500 ms (see FIG. 3), and so the labelling time of the pCASL labeling segment 56 should be in a similar range. The spatial gap between the imaging plane 64 and the labelling slice 60 is jointly determined by the flow velocity of the blood and the slice profile of the inversion RF pulse 50. Empirically, 10-20 mm separation is usually sufficient for most imaging applications. Since only the blood from the proximal plane will be labeled by the labeling train 56, only arterial blood will be eventually visualized in the MRA images 28 (see FIG. 1), thus suppressing the potential venous contamination.

The robust flow labeling SNAP (rSNAP) technique described with reference to FIG. 6 is widely applicable to image most of the major vascular beds in the human body for simultaneous MRA and IPH imaging. Advantageously, no special optimization based on flow velocity or patient population is needed for rSNAP sequences before the imaging session. The rSNAP sequence can also be used to jointly visualize both MRA and thrombosis. Differentiating thrombosis from regular vessel wall has generally been considered a challenging task. It can now be more readily imaged using rSNAP because it can be readily visualized in the positive image of the rSNAP with its short T1. The rSNAP technique is also advantageous in situations in which blood from only one side needs to be imaged since it can selectively label blood from only from the desired direction.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having described the preferred embodiments, the invention is now claimed to be:

1. A method comprising:
   inverting magnetic resonance spins by applying an inversion recovery (IR) radio frequency pulse to a subject disposed in a static ($B_0$) magnetic field;
   acquiring magnetic resonance signals from the subject at an inversion time (T1) after the IR radio frequency pulse;
   performing a blood flow labeling sequence after the inverting and before the acquiring; wherein the inversion time (T1) is selected such that blood flow labeled by the blood flow labeling sequence exhibits negative magnetism excited by the IR radio frequency pulse and intraplaque hemorrhage (IPH) tissue exhibits positive magnetism excited by the IR radio frequency pulse;
   reconstructing the acquired magnetic resonance signals to generate spatial pixels or voxels wherein a positive value for a spatial pixel or voxel indicates a spatial location of positive magnetism and a negative value for a pixel or voxel indicates a spatial location of negative magnetism;
   generating a first image representative of the blood flow labeled by the blood flow labeling sequence comprising the generated spatial pixels or voxels having negative signal intensities; and
   generating a second image representative of the IPH tissue comprising the generated spatial pixels or voxels having positive signal intensities.

2. The method of claim 1 wherein the blood flow labeling sequence is selected from the group consisting of: magnetization transfer insensitive labeling technique (TILT), flow-sensitive alternating inversion recovery (FAIR), continuous arterial spin labeling (CASL), and pulsed continuous arterial spin labeling (pCASL).

3. The method of claim 1 wherein the blood flow labeling sequence is spatially selective and operates on only one side of the field of view of the acquiring.

4. The method of claim 1 wherein the acquiring of magnetic resonance signals employs a gradient echo readout sequence.

5. The method of claim 4 wherein the gradient echo readout sequence comprises radio frequency pulses.

6. The method of claim 4 wherein the gradient echo readout sequence comprises radio frequency pulses with flip angles of less than or about 10 degrees.

7. The method of claim 4 wherein the gradient echo readout sequence comprises radio frequency pulses with flip angles of less than or about 5 degrees.

8. The method of claim 4 wherein the reconstructing comprises phase-sensitive reconstruction.

9. The method of claim 1 further comprising:
   generating a fused image or view that fuses the first image and the second image.

10. An apparatus comprising:
    a magnetic resonance scanner configured to perform operations including:
       inverting magnetic resonance spins by applying an inversion recovery (IR) radio frequency pulse to a subject disposed in a static ($B_0$) magnetic field,
       acquiring magnetic resonance signals from the subject at an inversion time (TI) after the IR radio frequency pulse, and
       performing a blood flow labeling sequence after the inverting and before the acquiring, wherein the inversion time (TI) is selected such that acquired blood signal of the blood flow labeled by the blood flow labeling sequence exhibits negative magnetism and acquired intraplaque hemorrhage (IPH) tissue signal exhibits positive magnetism; and
    an electronic data processing device configured to perform operations including:
       reconstructing the acquired magnetic resonance signals to generate an image comprising spatial pixels or voxels, and
       thresholding the spatial pixels or voxels to form a magnetic resonance angiography (MRA) image representative of blood flow labeled by the blood flow labeling sequence and an IPH image representative of IPH tissue.

11. The apparatus of claim 10 wherein the blood flow labeling sequence is selected from the group consisting of: magnetization transfer insensitive labeling technique (TILT), flow-sensitive alternating inversion recovery (FAIR), continuous arterial spin labeling (CASL), and pulsed continuous arterial spin labeling (pCASL).

12. The apparatus of claim 10 wherein the blood flow labeling sequence is spatially selective and operates on only one side of the field of view of the acquiring.

13. The apparatus of claim 10 wherein the acquiring includes applying a radio frequency excitation pulse train.

14. The apparatus of claim 10 wherein the reconstructing comprises phase-sensitive reconstruction.

15. The apparatus of claim 10 further comprising: combining the MRA image and the IPH image to generate a fused image in which the blood flow labeled by the blood flow labeling sequence and the IPH tissue are segmented.

* * * * *

UNITED STATES PATENT AND TRADEMARK OFFICE
CERTIFICATE OF CORRECTION

PATENT NO. : 9,523,753 B2
APPLICATION NO. : 14/112267
DATED : December 20, 2016
INVENTOR(S) : Jinnan Wang et al.

Page 1 of 1

It is certified that error appears in the above-identified patent and that said Letters Patent is hereby corrected as shown below:

In the Specification

Before the first line please add:
--This invention was made with Government Support under Grant nos R01 HL103609 & R21 NS072464 awarded by the National Institutes of Health. The government has certain rights in the invention.--

Signed and Sealed this
Second Day of April, 2019

Andrei Iancu
*Director of the United States Patent and Trademark Office*